United States Patent [19]

Fuller et al.

[11] 3,900,944

[45] Aug. 26, 1975

[54] METHOD OF CONTACTING AND CONNECTING SEMICONDUCTOR DEVICES IN INTEGRATED CIRCUITS

[75] Inventors: Clyde R. Fuller, Plano; Alan R. Reinberg, Dallas, both of Tex.

[73] Assignee: Texas Instruments, Incorporated, Dallas, Tex.

[22] Filed: Dec. 19, 1973

[21] Appl. No.: 426,384

[52] U.S. Cl. ...................... 29/578; 29/580; 156/13; 156/18; 204/192; 427/89; 427/264; 427/265; 29/591

[51] Int. Cl.[2] .........H01L 21/283; H01L 21/308; H01L 21/312

[58] Field of Search ................ 156/7, 8, 17, 18, 13; 117/212, 215, 217, 221; 204/192; 29/624, 625, 590, 578, 577, 580, 579, 628, 591

[56] References Cited

UNITED STATES PATENTS

| | | | |
|---|---|---|---|
| 3,256,588 | 6/1966 | Sikina et al. | 117/217 |
| 3,271,286 | 9/1966 | Lepselter | 156/17 |
| 3,653,999 | 4/1972 | Fuller | 156/17 |
| 3,717,563 | 2/1973 | Revitz et al. | 117/217 |
| 3,726,733 | 4/1973 | Nakamura et al. | 29/580 |
| 3,795,557 | 3/1974 | Jacob | 156/17 |
| 3,805,375 | 4/1974 | LaCombe et al. | 29/577 |
| 3,822,467 | 7/1974 | Symersky | 29/579 |

*Primary Examiner*—Charles E. Van Horn
*Assistant Examiner*—Jerome W. Massie
*Attorney, Agent, or Firm*—Harold Levine; James T. Comfort; Gary C. Honeycutt

[57] ABSTRACT

An improved method of forming interconnections on a semiconductor slice in which a barrier metal of TI:W or Ta is deposited followed by deposit of a conducting layer and then a masking layer of Ta after which the masking layer is patterned with photo-resist and plasma etched whereupon the conducting layer is sputter etched with the barrier layer then being removed to provide an interconnecting lead with sloping sides over which insulation and a second level of metallization may be applied without danger of problems at crossovers.

6 Claims, 4 Drawing Figures

METHOD OF CONTACTING AND CONNECTING SEMICONDUCTOR DEVICES IN INTEGRATED CIRCUITS

BACKGROUND OF THE INVENTION

This invention relates to semiconductors in general and more particularly to an improved method of forming interconnections on semiconductors such as integrated circuits which include a large plurality of semiconductor devices and require a large plurality of interconnections with narrow spacing.

Integrated circuits are presently being constructed within the range of 5,000 to 10,000 devices on a single slice or chip. Such construction requires a large plurality of interconnections which are narrowly spaced and in some cases requires multiple levels of interconnections. As disclosed in application, Serial No. 426,408, titled A METHOD OF FORMING CONTACT AND INTERCONNECT GEOMETRIES FOR SEMICONDUCTOR DEVICES AND INTEGRATED CIRCUITS, and filed on even date herewith and assigned to the same assignee as the present invention, the prior art methods of forming such interconnections resulted in failures due to problems at crossovers. The above application discloses a method of overcoming this difficulty in which sputter etching of the conductor, generally gold, is done and in which aluminum masking is used. The method disclosed and claimed therein requires a plurality of steps and can require two different vacuum systems for metal deposition. Thus, there is a need for an improved system which will provide the advantages of the above application but may be accomplished in a simpler fashion.

SUMMARY OF THE INVENTION

The main requirement in a system which will permit good control of the interconnect geometry and provide the conductor with sloping sides is that the conductor be sputter etched. In the method previously disclosed, aluminum was used as a mask for this sputter etching constituting another layer which had to be deposited, etched and removed. The present invention avoids the use of the aluminum mask by using instead a tantalum mask in place of the second Ti:W layer used in the previously disclosed method. That is, in the method of the above identified application, a layer of titanium: tungsten was first deposited to serve as a barrier metal, then a layer of the conducting metal such as gold deposited and finally another layer of titanium: tungsten deposited to serve as a barrier between the gold and a subsequent insulating layer which was placed thereover so that a second level of interconnections could be made. In addition to these layers, a layer of aluminum was required to carry out the sputter etching of the gold. The present invention replaces the second Ti:W layer with a layer of tantalum (Ta), which layer serves both the purposes of the Ti:W layer and the aluminum layer of the former invention.

Tantalum like aluminum forms a tightly adhering coherent oxide, and thus will serve as a sputter etching mask for the gold when the gold is sputter etched in argon plus a small percentage of oxygen. Thus, the sloped cross-sections necessary for good cross-overs are obtained through the present invention. This is all accomplished without the need for etching or removal of the top Al layer as was previously required.

In carrying out the present invention, the semiconductor devices are prepared in accordance with well-known practices, including, for example, the step of forming platinum silicide contacts in the appropriate regions. After this, the excess platinum is removed, the slices are cleaned in accordance with known methods. Thereupon, sequential layers of either Ti:W-AU-Ta or Ta-Au-Ta are then vacuum deposited onto the slices. If Ti:W is used, it must be sputtered on. Tantalum and gold, however, may be deposited by evaporation. However, RF sputtering is the preferred technique for all metals. The first level interconnections then formed on the top Ta layer by depositing a photo-resist exposing and develop curing this layer to obtain the required pattern. The top Ta layer is then RF plasma etched in $CF_4$ with oxygen. After this the gold is sputter etched and the barrier metal then etched. If Ti:W is the barrier metal it may be etched in $H_2O_2$. If Ta-Au-Ta is used the bottom Ta layer is etched in $CF_4$ plasma. This will, of course, remove the top layer resulting in only Ta-Au. This latter process is thus usable only in single level applications where the top layer of Ta is not needed as a barrier for insulation to be applied over the gold. When making double level metallization, the patterned Ti:W-Au-Ta is then insulated with an insulation layer and the necessary via holes then formed through to the metal layer. Via etching of the top tantalum layer may be done using $CF_4$ in plasma vapor. After applying the insulation, the slices are then recleaned, and second level metallization applied. This can be anything compatible and which adheres to the oxide and will form a proper contact with the first level metal. The top level can then be patterned using any well-known procedure or the procedure described herein. Beam leads or bumps for flip-chip bounding can also be provided.

DETAILED DESCRIPTION OF THE PREFERRED EMBODIMENT

Figure 1:
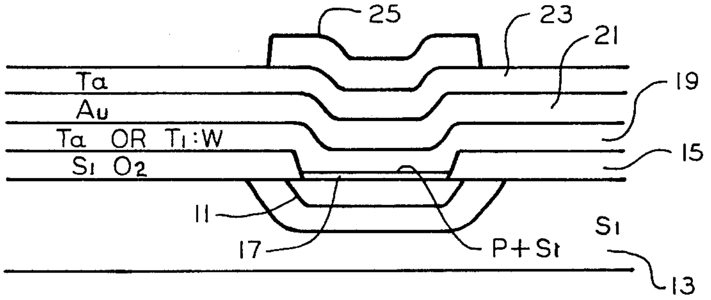
FIG. 1 is a cross-sectional view showing the layers of the present invention.

The silicon slice will be formed having a plurality of devices 11 in the substrate 13. In well-known fashion, a layer 15 of silicon dioxide is formed atop the slice. In the area of the device 11 where contact is to be made, the surface will have been cleaned and a layer of platinum silicide 17 formed to make good contact with the metals to be deposited. According to the method of the present invention, a layer of either tantalum or Ti:W 19 is first deposited on the slice. Preferably, this will be done using RF sputtering although if Ta is used it may be deposited by evaporation. Atop this layer is deposited a layer 21 of gold. Gold may also be deposited by evaporation although RF sputtering is also preferred for this layer. Atop layer 21 is deposited a layer 23 of Ta which again may be deposited by evaporation but will preferably be deposited by RF sputtering. Typically, the barrier layer 19 will be 1,500 A thick, the conducting layer 21 10,000 A [other conductors such as copper or silver may also be used] and the masking layer 23 1,000 A thick. On top of the layer 23 a photo-resist film is deposited and then exposed with the desired interconnect pattern after which it is developed and cured. This will result in a layer 25 of photo-resist material in the areas where conductors are desired.

Figure 2:
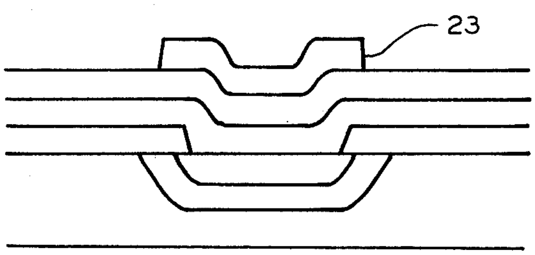
FIG. 2 is a similar view after selective removal of the top Ta layer.
Figure 3:
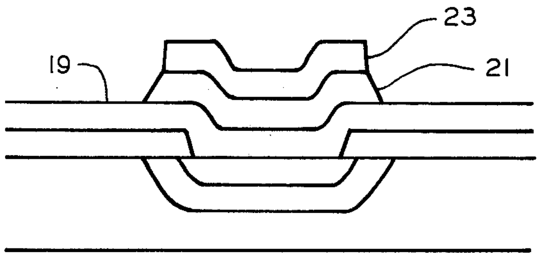
FIG. 3 is a similar view after sputter etching of the gold.

The top layer 23 of Ta is then etched using RF plasma etching in $CF_4$. The result will be as shown on FIG. 2. As shown thereon, the photo-resist 25 has also been removed after the etching of the Ta 23. This can be accomplished by ashing in the plasma etch machine in oxygen. The slices are then placed on an RF electrode [Al or Ta surface] in a vacuum system and sputter etched at 1.5 ± 0.5 milli-torr with 0.14 ± 0.1 watt/cm until the gold has been removed. This pressure is critical to achieve the sloped metal cross sections. Faster sputtering rates using higher power may be employed if adequate slice cooling is available. Preferably, the slice should be kept at or below 200° C. After sputter etching, the slice will appear as shown in FIG. 3. Note that the gold 21 has sloping edges so that it will be able to have an insulating layer and another layer of metallization placed over it without the danger of problems at cross-overs. The layer 10 is now etched. If Ti:W was used as the barrier layer 19, it may be etched in $H_2O_2$ at about 15°to 35° C. which will not attack the Ta, gold or silicon substrate. Further, the absence of any resulting undercut points up an advantage, i.e., virtually no sensitivity to excessive etching. If the barrier metal were instead Ta, the bottom Ta layer can be etched in $CF_4$ plasma. This will result, of course, in the top layer also being removed. Only the bottom layer of Ta and the layer of gold remain. Since silicon dioxide does not adhere well to the gold, this makes the arrangement unsuitable for multiple level interconnect systems. Thus, where multiple level interconnect systems are being constructed, TI:W is the preferred metal. Alternatively, a layer of aluminum Ta can be plasma etched as described above without the top layer being removed. After etching of the bottom layer, the aluminum may then be removed using conventional techniques and leaving an arrangement suitable for multiple level interconnects.

Figure 4:
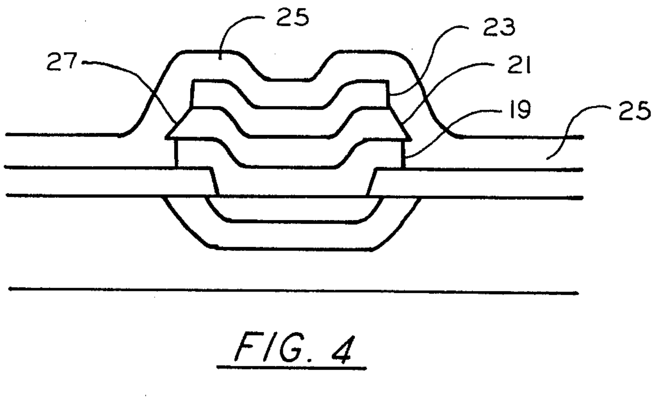
FIG. 4 is a similar view after selective removal of the barrier and application of an insulating layer.

FIG. 4 illustrates the arrangement after the bottom layer of metal has been etched and an insulation layer applied 27 over the slice. This insulation can comprise a layer of silicon nitride deposited by plasma vapor deposition from silane and ammonia followed by a layer of silicon dioxide deposited by:

a. plasma vapor deposition from silane and oxygen;
b. reaction of silane and oxygen at temperatures greater than 300°C.;
c. reaction of tetra-ethylene-ortho-silicate on oxygen; or
d. RF sputtering of quartz. Further, the insulation layer could be a layer of a single dielectric or two or more layers of the same dielectric material deposited by different methods. The thin plasma nitride layer is advantageous in that it exhibits reasonable adhesion to gold and provides better insulation over the sloped gold edges 27.

After depositing the insulation via holes can be etched in the insulation layer and metal layer to appropriate circuit points in the first level metallization. Such methods are disclosed in the above identified applications. The top Ta layer at the vias may be etched using the $CF_4$ plasma vapor etch described above. The slices may then be cleaned and, assuming the insulation is properly applied, very hard cleaning procedures may be employed including $H_2O_2$ - $H_2SO_4$ solutions. Tantalum and gold are not attacked by this solution and the Ti:W will be protected by the insulation. After cleaning, the second level metallization can be applied. This can be any number of a plurality of metallization such as Ti:W-Au-Ta-Au, Ti:W-Al and so on. Any metal system compatible with and which adheres to the oxide and will properly contact the first level metallization and having good conductivity may be used. After deposition, the top level may be patterned using any well-known techniques or using the technique disclosed herein. The necessity of forming the leads on this top level to have sloping sides is not as important since another layer is not being placed thereover. However, advantages in the control of lead geometry may still be obtained by using the method of the present invention.

Thus, an improved method of forming contacts on a semiconductor slice has been described. Although a specific embodiment has been illustrated and described, it will be obvious to those skilled in the art that various modifications may be without departing from the spirit of the invention which is intended to be limited by the appended claims.

What is claimed is:

1. The method of forming an interconnection pattern on an integrated circuit slice comprising the steps of:
a. depositing a barrier layer of one of the group consisting of Ti:W and Ta over said slice;
b. depositing over said barrier layer a conducting layer;
c. depositing over said conducting layer a masking layer of Ta;
d. developing an interconnect pattern of photoresist material atop said masking layer of Ta;
e. RF plasma etching said masking Ta layer in a $CF_4$ plasma;
f. removing said photo-resist material;
g. sputter etching the exposed portions of said conductor layer using said etched Ta layer as a mask, under conditions which cause an oxide layer to form on said mask; and
h. etching to remove the exposed portions of said barrier layer.

2. The invention according to claim 1 wherein said conducting layer is sputter etched in an inert gas containing approximately 1% oxygen at 2.5 ± 2 mili-torrs.

3. The invention according to claim 2 wherein said barrier layer is Ti:W and is removed using 30–35% $H_2O_2$ solution at a temperature in the range of 15° – 35° C.

4. The invention according to claim 1 and further including the steps of:
a. depositing an insulating layer over said slice and the interconnecting pattern; and
b. depositing a second layer of metallization over said insulating layer; and
c. forming a second interconnection pattern in said second layer of metallization.

5. The invention according to claim 1 wherein said barrier layer is Ta and wherein said barrier layer is removed by plasma etching in $CF_4$ thereby resulting in removal of all of said top tantalum layer.

6. The invention according to claim 1 wherein said conducting layer is gold.

* * * * *